United States Patent
Chen et al.

(10) Patent No.: US 9,762,191 B1
(45) Date of Patent: Sep. 12, 2017

(54) SYSTEM AND METHOD FOR OFFSET CANCELLATION FOR DRIVING A DISPLAY PANEL

(71) Applicant: Solomon Systech Limited, Hong Kong (HK)

(72) Inventors: Jun Chen, Hong Kong (HK); Yiu Sang Lei, Hong Kong (HK); Wei Jun Koh, Singapore (SG); Cheung Fai Lee, Hong Kong (HK)

(73) Assignee: Solomon Systech Limited, Hong Kong (HK)

( * ) Notice: Subject to any disclaimer, the term of this patent is extended or adjusted under 35 U.S.C. 154(b) by 40 days.

(21) Appl. No.: 15/135,578

(22) Filed: Apr. 22, 2016

(51) Int. Cl.
| | |
|---|---|
| *H03F 3/38* | (2006.01) |
| *G09G 3/20* | (2006.01) |
| *G09G 5/02* | (2006.01) |
| *G06T 7/00* | (2017.01) |

(52) U.S. Cl.
CPC .......... *H03F 3/38* (2013.01); *G06T 7/00* (2013.01); *G09G 3/2085* (2013.01); *G09G 3/2092* (2013.01); *G09G 5/02* (2013.01); *G09G 2310/0254* (2013.01); *G09G 2310/0291* (2013.01); *G09G 2310/0297* (2013.01); *G09G 2320/0204* (2013.01); *G09G 2320/0233* (2013.01); *G09G 2320/0247* (2013.01); *G09G 2320/0613* (2013.01); *G09G 2320/0673* (2013.01); *H03F 2200/375* (2013.01)

(58) Field of Classification Search
CPC ... H03F 3/38; H03F 2200/375; G09G 3/2092; G09G 5/02; G09G 3/2085; G09G 2320/0247; G09G 2310/0254; G09G 2320/0204; G09G 2320/0233; G09G 2310/0297; G09G 2320/0613; G09G 2320/0673; G06T 7/00
See application file for complete search history.

(56) References Cited

U.S. PATENT DOCUMENTS

| | | | |
|---|---|---|---|
| 6,870,524 B2 | 3/2005 | Katsutani | |
| 7,385,443 B1 * | 6/2008 | Denison | ........... H03F 3/38 330/10 |
| 7,852,304 B2 | 12/2010 | Lee et al. | |
| 7,893,909 B2 | 2/2011 | Sung | |
| 8,520,034 B2 | 8/2013 | Rao | |
| 2005/0237001 A1 * | 10/2005 | Hayafuji | ........... G09G 3/3233 315/169.2 |

(Continued)

*Primary Examiner* — Andrew Sasinowski

(57) ABSTRACT

A system for offset cancellation for driving a display panel includes: a plurality of source amplifiers driving the display panel; an image analyzer configured to receive a data input of an image frame and analyze the data input; and a chopping pattern controller connected with the image analyzer and configured to determine a chopping pattern that fits the data input based on analysis results of the image analyzer, and apply the determined chopping pattern to the source amplifiers. The source amplifiers are divided into N groups while the chopping pattern controller is configured to drive source amplifiers in each group by a single chopping control signal. The image analyzer is configured to generate an indicator that indicates whether image data being analyzed corresponds to a general image or one of pre-registered killer pattern images. A method for offset cancellation for driving a display panel is also provided.

20 Claims, 16 Drawing Sheets

(56) References Cited

U.S. PATENT DOCUMENTS

| | | | |
|---|---|---|---|
| 2008/0183098 A1* | 7/2008 | Denison | A61B 5/0002 600/547 |
| 2009/0109198 A1* | 4/2009 | Kim | G09G 3/006 345/204 |
| 2014/0354354 A1* | 12/2014 | Goeke | H03F 3/45 330/69 |
| 2015/0222252 A1* | 8/2015 | Kim | H03K 5/003 327/307 |

* cited by examiner

1: Analyze whole image

2: Analyze Representative Regions: top few lines and bottom few lines

3: Analyze Representative Regions: four corners and center

4: Analyze small regions of the image separately

FIG. 10

(A) One pattern shown here is alternating chopping configuration every row. (X,Y,X,Y,...)

(B) Another pattern is alternating every two rows. (X,X,Y,Y,...)

| Example images | Chopping Pattern (A) | Chopping Pattern (B) |
|---|---|---|
| Killer pattern image | Flickering | No Flickering |
| Single-tone or checkerboard image | No Flickering | No Flickering |

| | Source Chopping | Gamma Chopping | Cascade Effect |
|---|---|---|---|
| 1 | Static | Static | Flickering on killer patterns |
| 2 | Adaptive | Static | Flickering on killer patterns |
| 3 | No | Static | Source output non-uniform |
| 4 | Static | Adaptive | Flickering on killer patterns |
| 5 | Adaptive | Adaptive | Least flickering. (No flickering on detectable killer patterns.) |
| 6 | No | Adaptive | Source output non-uniform |
| 7 | Static | No | Flickering on killer patterns. Cascade drivers non-uniform |
| 8 | Adaptive | No | Cascade drivers non-uniform |
| 9 | No | No | Source output non-uniform. Cascade drivers non-uniform |

FIG. 16

SYSTEM AND METHOD FOR OFFSET CANCELLATION FOR DRIVING A DISPLAY PANEL

FIELD OF THE PATENT APPLICATION

The present patent application generally relates to driving display panels and more specifically to a system and a method to execute offset cancellation of source amplifiers in an integrated circuit controller driver according to display image characteristics, to improve display uniformity and reduce display flaws such as flickering and vertical waves.

BACKGROUND

The resolution of display panels are getting higher and higher. This results in large amounts of source driver outputs in the driving circuit. Each of these source driver output includes a source amplifier. A FHD (Full High Definition 1920×1080) RGB display driver IC includes 3240 source amplifiers. Variation among these amplifiers would result in display non-uniformity.

One of the major causes of variation is the input offsets of the amplifiers. Conventional design methodology to reduce input offset is to increase the device sizes and to increase the static bias current. In contrary, in high resolution display driver ICs, as more and more source amplifiers have to be squeezed, there is strong demand to reduce the device sizes and to reduce the bias current of each amplifier. For very high resolution displays, the number of source amplifiers is so large that they cannot reside in a single display driver IC. Thus, two or more display driver ICs cascade together to drive a single display panel. This leads to further challenge to maintain uniformity among the source amplifiers in different display driver ICs.

Chopping is a method to overcome input offset problem of amplifier circuits. Referring to FIG. 1, the two configurations of the amplifier circuit would produce input offsets in opposite directions with almost the same magnitude. By repeatedly alternating the two directions, the average value of the amplifier output voltage would be much closer to the input voltage. In particular to LCD displays, for the nature of liquid crystal which may only be driven by a waveform of zero DC component, a bipolar driving waveform is used (as shown in FIG. 2), "+" and "−" denote the two polarities. The polarity changes once for each frame, thus the average (DC) voltage is zero. Other display technologies may not have this requirement, e.g. AMOLED may be driven by a waveform consisting of a DC component. "+VH" and "−VH" denote the 2 voltage levels of the 2 driving polarities for VH greyscale level pixels. "+VL" and "−VL" denote the 2 voltage levels of the 2 driving polarities for VL greyscale level pixels.

Chopping Pattern throughout this specification refers to the way how the source amplifiers X-Y chopping circuit configuration alternates in each row and each frame. It can be denoted by multiple frames and each frame as a matrix of 'X' and 'Y' characters. Column inversion is a scheme that all pixels of a column of the display have the same driving polarity and the pixels of the neighboring columns have the opposite driving polarity.

Figure 3:
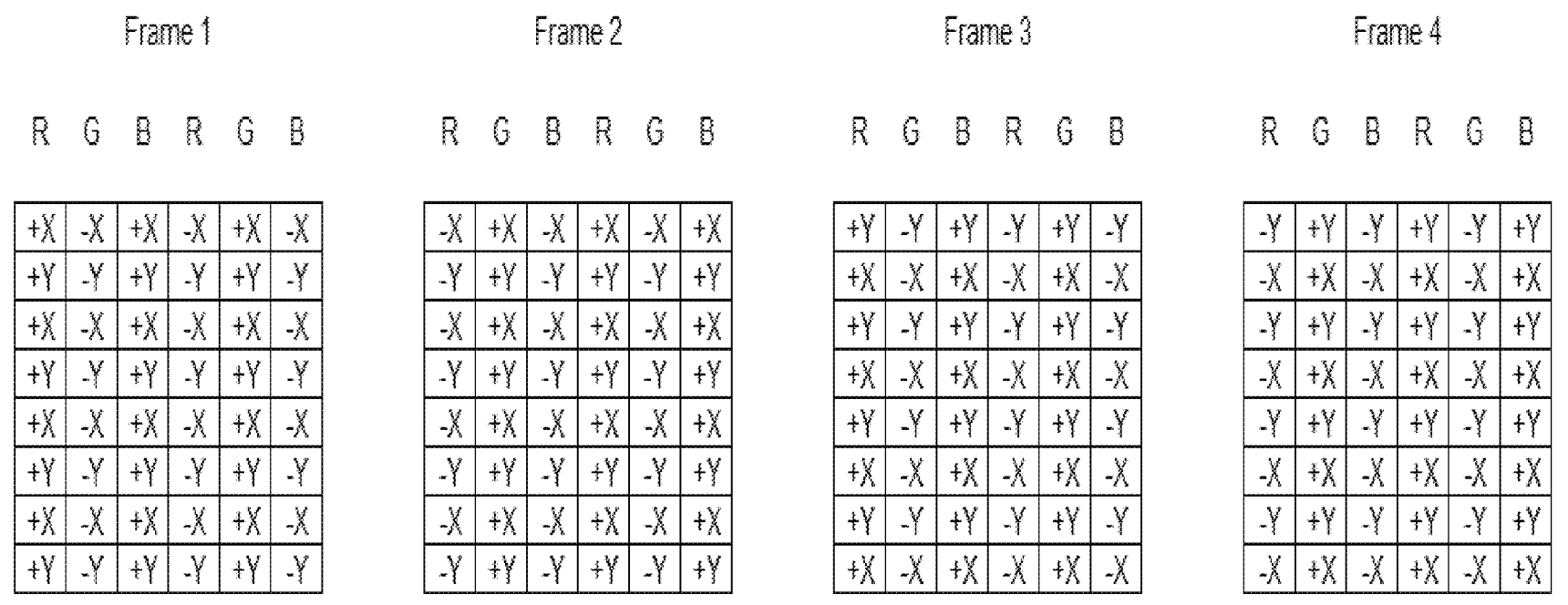

FIG. 3 shows a chopping pattern with column inversion of driving polarity. Referring to FIG. 3, "+" or "−" denotes the driving polarity. Each pixel would undergo all four combinations of +X, −X, +Y and −Y in some different sequences. So, in average the brightness levels of the pixels of the same greyscale level appear to be uniform. Pixels of opposite chopping directions X and Y are well mixed (high spatial domain frequency.) It does not cause flickering for most images. However, some images driven by this chopping pattern would introduce low spatial domain frequency components by some pixels of the same greyscale level. These images are killer pattern images to this chopping pattern. Another chopping pattern could be devised to accommodate this image. However, such chopping pattern is also subjected to flickering problem with some other images.

Figure 4:
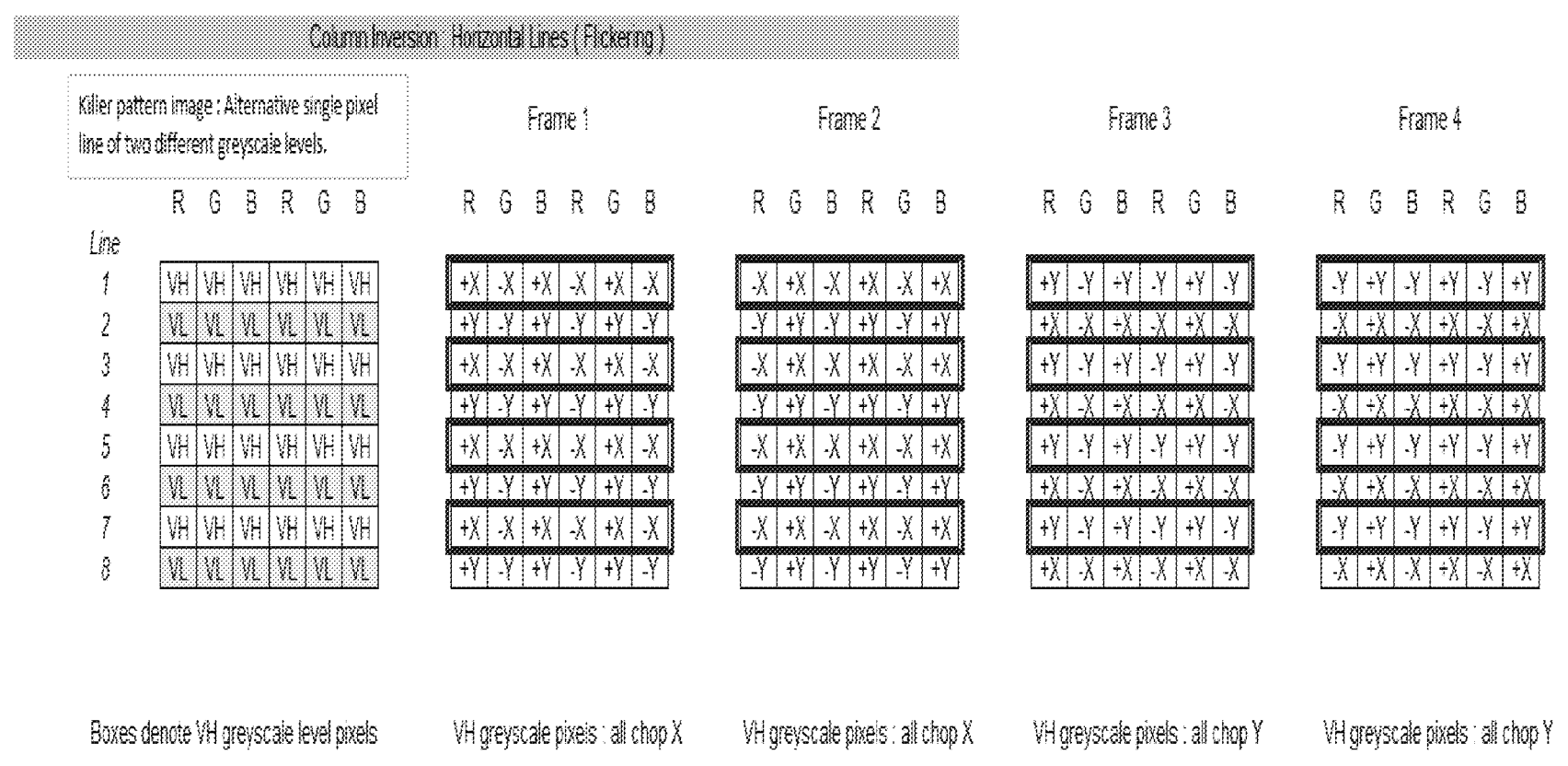

FIG. 4 shows a killer pattern image example to a chopping pattern, which is alternating single-pixel width lines of two different greyscale levels. Referring to FIG. 4, coincidently, the image matches the chopping pattern such that all VH greyscale level pixels in a large area of the image have the same chopping directions in all frames (low spatial domain frequency): chopping direction X in Frame 1 and Frame 2, direction Y in Frame 3 and Frame 4. Similarly pixels of VL greyscale level also have the same problem. Flickering in ¼ of the frame refresh frequency becomes observable.

The input voltage of source amplifiers come from the gamma circuit. There are amplifiers (Gamma amplifiers) in the gamma circuit. The outputs of the gamma circuit in a two or more cascade display drivers can be slightly different due to input offsets of these amplifiers. Therefore chopping technique may be applied to these amplifiers so that the average output voltages of the gamma amplifiers in these display drivers are much closer. Thus, the chopping pattern covers both gamma amplifiers and source amplifiers. However, such chopping are subject to flickering problem with killer pattern images, the same as source amplifier chopping as aforementioned.

SUMMARY

The present patent application is directed to a system and a method for offset cancellation for driving a display panel. In one aspect, the method includes: receiving a data input of an image frame with an image analyzer; analyzing the data input with the image analyzer; determining a chopping pattern that fits the data input based on analysis results of the image analyzer, with a chopping pattern controller; and applying the determined chopping pattern to a plurality of source amplifiers with the chopping pattern controller. The source amplifiers drive the display panel. The source amplifiers are divided into N groups, source amplifiers in each group being driven by a single chopping control signal. Image data corresponding to representative regions of the image frame is analyzed by the image analyzer. Chopping control signals for different regions of the image frame are determined by the chopping pattern controller. An indicator that indicates whether the image data being analyzed corresponds to a general image or one of pre-registered killer pattern images is generated by the image analyzer. Based on the indicator, a corresponded chopping pattern is generated by a chopping signal generator in the chopping pattern controller and transmitted to the source amplifiers thereby.

Source amplifiers of one group may be packed together and separated from those of other groups. Source amplifiers of different groups may be mixed and packed together. Source amplifiers of different groups may be mixed in an alternating fashion. The chopping pattern may be alternating chopping configuration every a number of rows.

Chance that the image frame has areas of pre-registered killer pattern image characteristics may be determined by the image analyzer, based on which a chopping pattern is chosen by the chopping pattern controller. The method may further include applying a fixed gamma chopping pattern to a plurality of gamma amplifiers with the chopping pattern controller.

The method may further include determining a gamma chopping pattern that fits the data input based on analysis results of the image analyzer with the chopping pattern controller; and applying the determined gamma chopping pattern to a plurality of gamma amplifiers with the chopping pattern controller.

In another aspect, the present patent application provides a system for offset cancellation for driving a display panel. The system includes: a plurality of source amplifiers driving the display panel; an image analyzer configured to receive a data input of an image frame and analyze the data input; and a chopping pattern controller connected with the image analyzer and configured to determine a chopping pattern that fits the data input based on analysis results of the image analyzer, and apply the determined chopping pattern to the source amplifiers. The source amplifiers are divided into N groups while the chopping pattern controller is configured to drive source amplifiers in each group by a single chopping control signal. The image analyzer is configured to analyze image data corresponding to the whole image frame or representative regions of the image frame. The chopping pattern controller is configured to determine chopping control signals for the whole image. The image analyzer is configured to generate an indicator that indicates whether the image data being analyzed corresponds to a general image or one of pre-registered killer pattern images. The chopping pattern controller includes a plurality of chopping signal generators and a multiplexor connected to the chopping signal generators. Based on the indicator, one of the chopping signal generators is configured to generate a corresponded chopping pattern and the multiplexor is configured to multiplex the chopping pattern and transmit the chopping pattern to the source amplifiers.

Source amplifiers of different groups may be mixed and packed together. Source amplifiers of different groups may be mixed in an alternating fashion. The chopping pattern may be alternating chopping configuration every a predetermined number of rows.

The image analyzer may be configured to determine chance that the image frame has areas of a pre-registered killer pattern image characteristic, based on which the chopping pattern controller is configured to choose a chopping pattern. The chopping pattern controller may be configured to apply a fixed chopping pattern to a plurality of gamma amplifiers.

The chopping pattern controller may be configured to determine a gamma chopping pattern that fits the data input based on analysis results of the image analyzer; and the chopping pattern controller may be configured to apply the determined gamma chopping pattern to a plurality of gamma amplifiers.

In yet another aspect, the present patent application provides a system for offset cancellation for driving a display panel. The system includes: a plurality of source amplifiers driving the display panel; an image analyzer configured to receive a data input of an image frame and analyze the data input; and a chopping pattern controller connected with the image analyzer and configured to determine a chopping pattern that fits the data input based on analysis results of the image analyzer, and apply the determined chopping pattern to the source amplifiers. The source amplifiers are divided into N groups while the chopping pattern controller is configured to drive source amplifiers in each group by a single chopping control signal. The image analyzer is configured to generate an indicator that indicates whether image data being analyzed corresponds to a general image or one of pre-registered killer pattern images.

The image analyzer may be configured to analyze image data corresponding to representative regions of the image frame; while the chopping pattern controller may be configured to determine chopping control signals for the whole image frame.

The chopping pattern controller may be configured to apply a fixed chopping pattern to a plurality of gamma amplifiers. The chopping pattern controller may be configured to determine a gamma chopping pattern that fits the data input based on analysis results of the image analyzer; and the chopping pattern controller may be configured to apply the determined gamma chopping pattern to a plurality of gamma amplifiers.

The chopping pattern controller may include a plurality of chopping signal generators and a multiplexor connected to the chopping signal generators. Based on the indicator, one of the chopping signal generators may be configured to generate a corresponded chopping pattern and the multiplexor may be configured to multiplex the chopping pattern and transmit the chopping pattern to the source amplifiers.

BRIEF DESCRIPTIONS OF THE DRAWINGS

FIG. 3 shows a chopping pattern with column inversion of driving polarity.

FIG. 4 shows a killer pattern image example to a chopping pattern.

FIG. 10 illustrates two examples of possible chopping pattern options for a 1-Group order of chopping control signals.

FIG. 11 illustrates the results (with or without flickering) of two chopping patterns being applied to two images.

FIG. 13 illustrates a working example of the method depicted in FIG. 12.

FIG. 16 shows a table illustrating comparison between cascade effects under different source chopping and gamma chopping.

DETAILED DESCRIPTION

Reference will now be made in detail to a preferred embodiment of the system and the method for offset cancellation for driving a display panel disclosed in the present patent application, examples of which are also provided in the following description. Exemplary embodiments of the system and the method for offset cancellation for driving a display panel disclosed in the present patent application are described in detail, although it will be apparent to those skilled in the relevant art that some features that are not particularly important to an understanding of the system and the method for offset cancellation for driving a display panel may not be shown for the sake of clarity.

Furthermore, it should be understood that the system and the method for offset cancellation for driving a display panel disclosed in the present patent application is not limited to the precise embodiments described below and that various changes and modifications thereof may be effected by one skilled in the art without departing from the spirit or scope of the protection. For example, elements and/or features of different illustrative embodiments may be combined with each other and/or substituted for each other within the scope of this disclosure.

Figure 1:
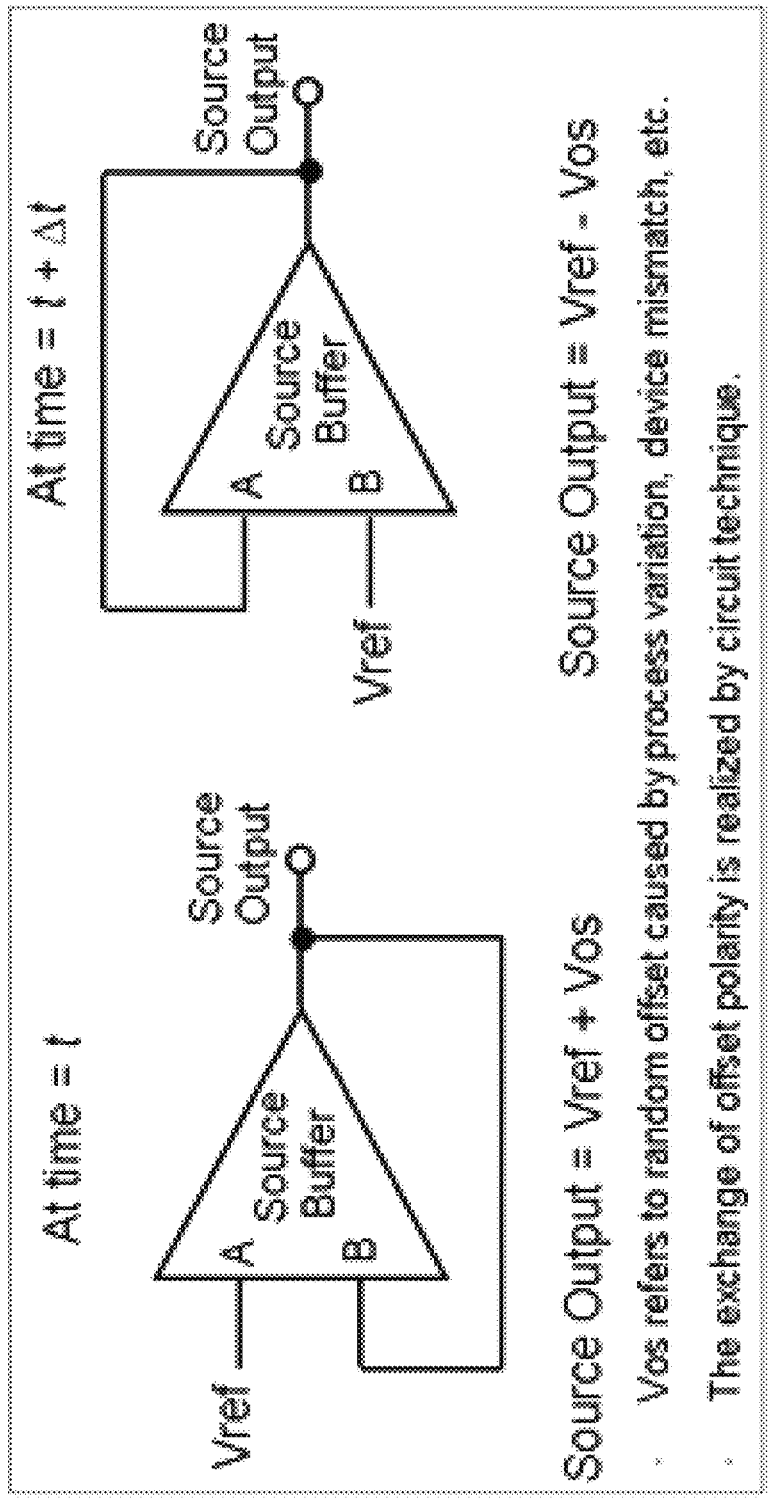
FIG. 1 is a circuit diagram illustrating chopping as a method to overcome input offset of amplifier circuits.
Figure 2:
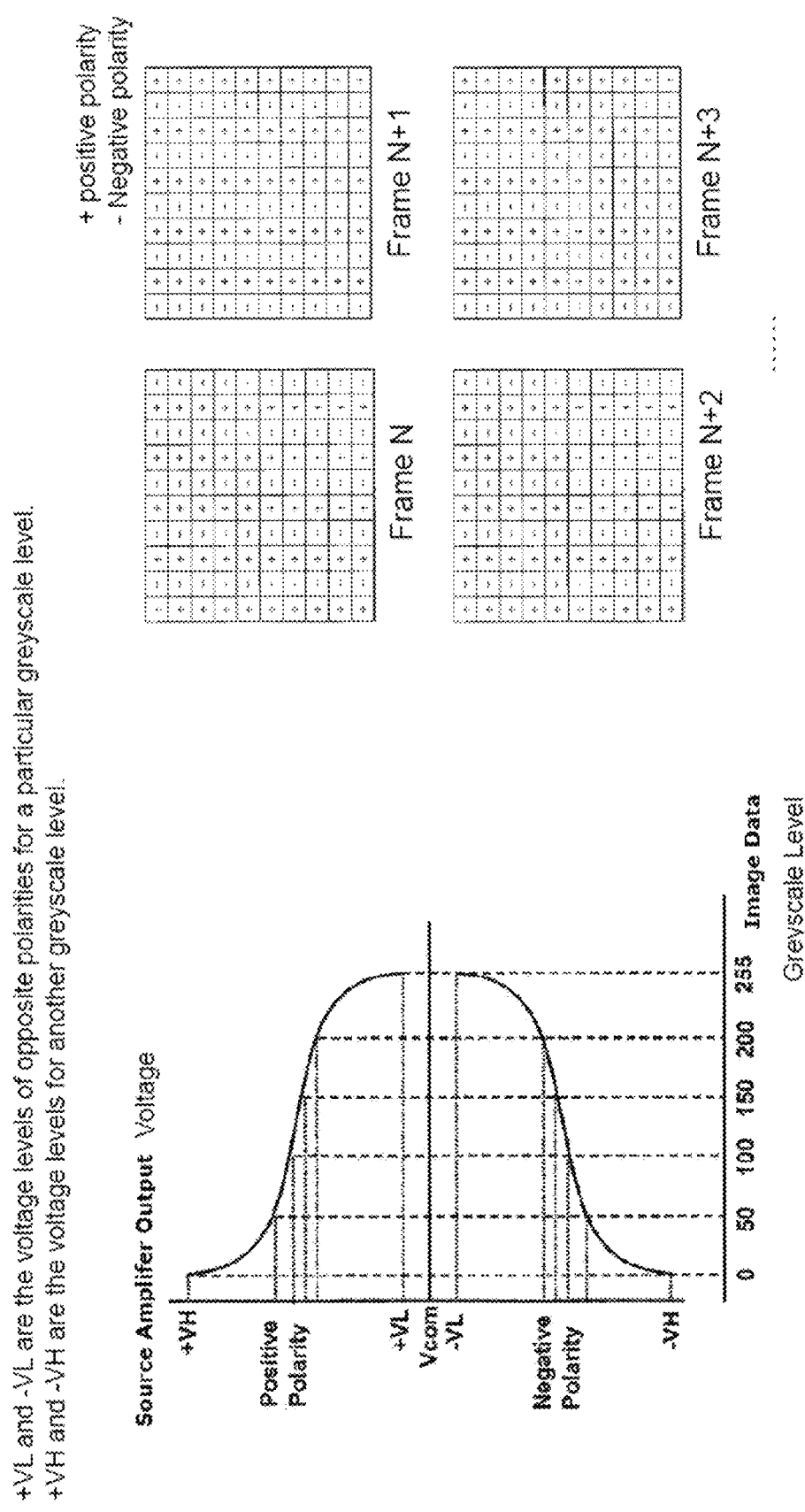
FIG. 2 is a diagram illustrating source polarity and column inversion.
Figure 5:
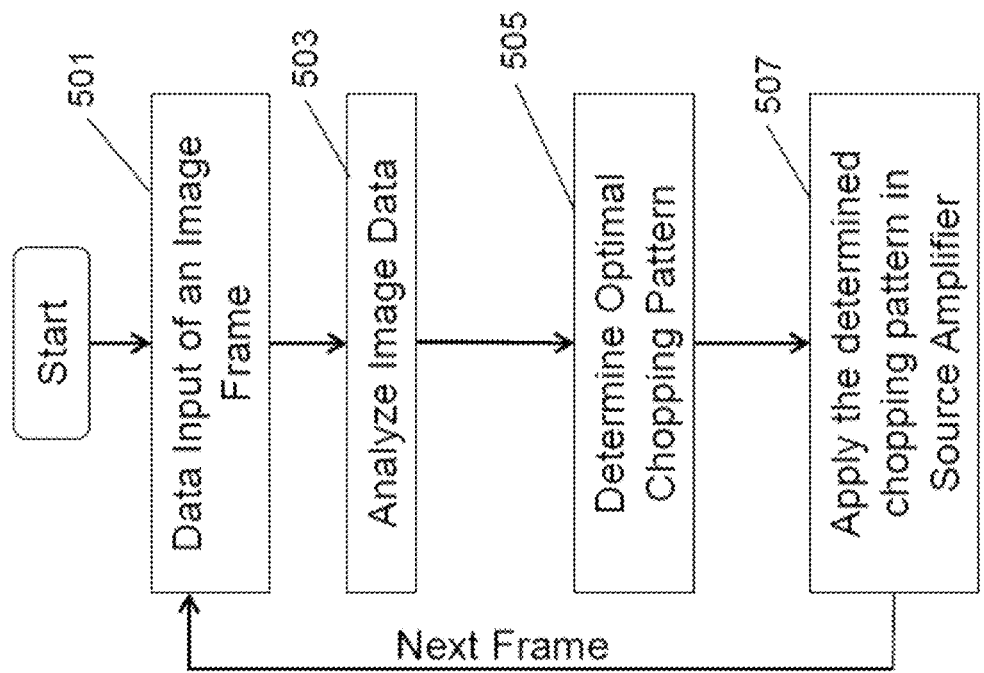
FIG. 5 is a flow chart illustrating a method for offset cancellation for driving a display panel in accordance with an embodiment of the present patent application.

FIG. 5 is a flow chart illustrating a method for offset cancellation for driving a display panel in accordance with an embodiment of the present patent application. Referring to FIG. 5, the method for offset cancellation for driving a display panel includes receiving a data input of an image frame with an image analyzer (step 501); analyzing the data input (i.e. image data) with the image analyzer (step 503); determining an optimal chopping pattern with a chopping pattern controller (step 505); and applying the determined chopping pattern to a plurality of source amplifiers with the chopping pattern controller (step 507).

Figure 6:
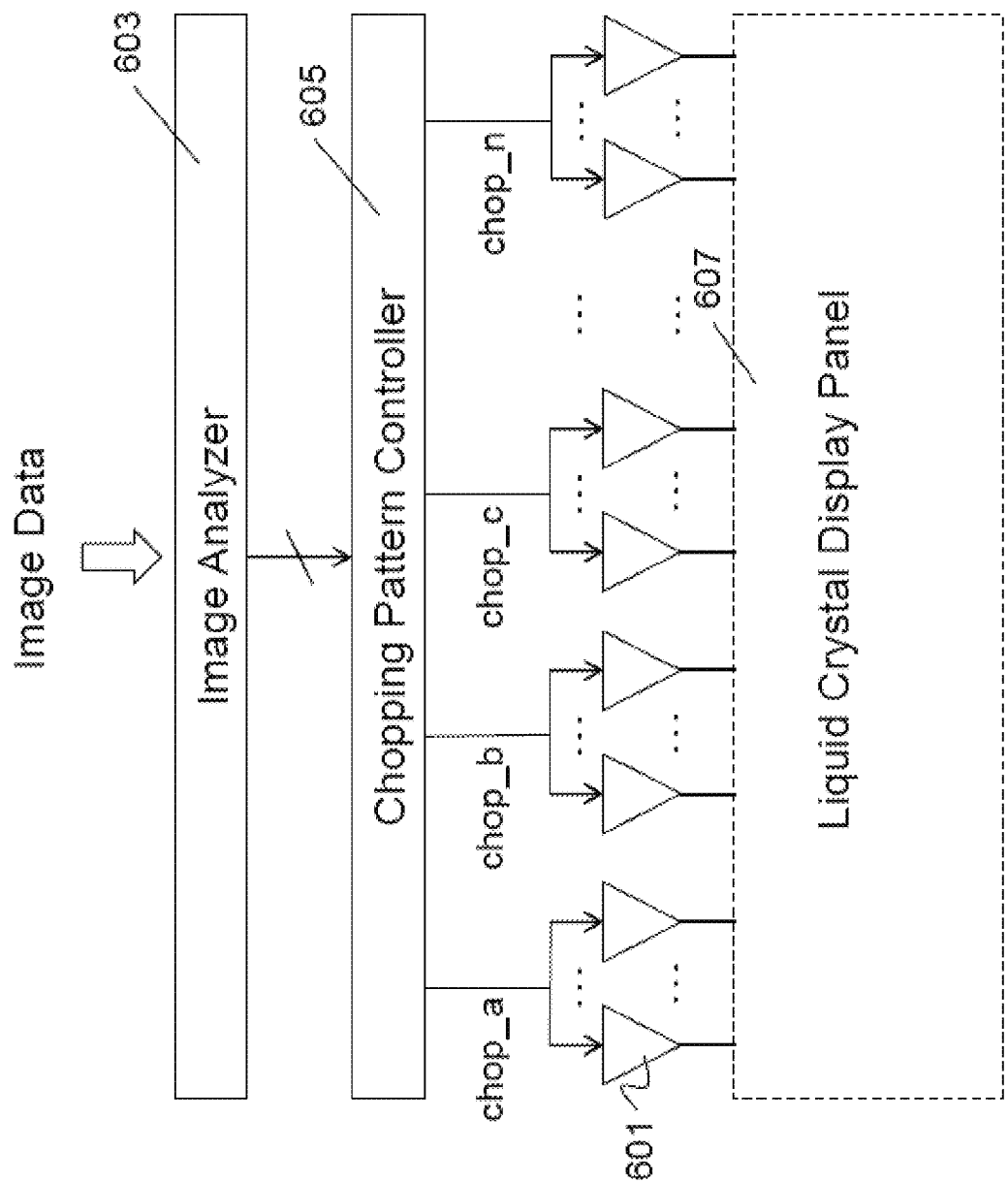
FIG. 6 is a schematic diagram of a system for offset cancellation for driving a display panel in accordance with another embodiment of the present patent application.

FIG. 6 is a schematic diagram of a system for offset cancellation for driving a display panel in accordance with another embodiment of the present patent application. Referring to FIG. 6, in this system, each source amplifier 601 is driven by a control signal to select one of X-Y configurations. Since it is impractical to have thousands control signals to make the selection for each source amplifier individually, the source amplifiers are divided into N groups. N could be one or more. Source amplifiers in each group share (i.e. are driven by) one single chopping control signal (i.e. chop_x). The source amplifiers of these groups can be in different orders. For example, in this embodiment, source amplifiers of one group are packed together and separated from those of other groups. In another embodiment, source amplifiers of different groups are mixed and packed together. The number of groups and the order are hardware constraints on the possible chopping pattern options.

Referring to FIG. 6, the system for offset cancellation for driving a display panel includes an image analyzer 603 configured to receive a data input of an image frame and analyze the data input, of the whole image or representative regions of the image; a chopping pattern controller 605 connected with the image analyzer and configured to determine a chopping pattern of a whole image frame and apply the determined chopping pattern to N groups of source amplifiers, which drive the LCD panel 607.

In this embodiment, there are N groups of source amplifiers 601. The N chopping control signals are chop_a, chop_b, chop_c, . . . , chop_n. The order is:
N-group aa . . . aabb . . . bbcc . . . ccdd . . . nn . . . nn The source amplifiers 601 are divided into N groups of control signals in sequence without overlaps, as shown in FIG. 6.

Examples of other possible chopping control signal groupings and orders are shown below:

1-group aa . . . aa

Figure 7:
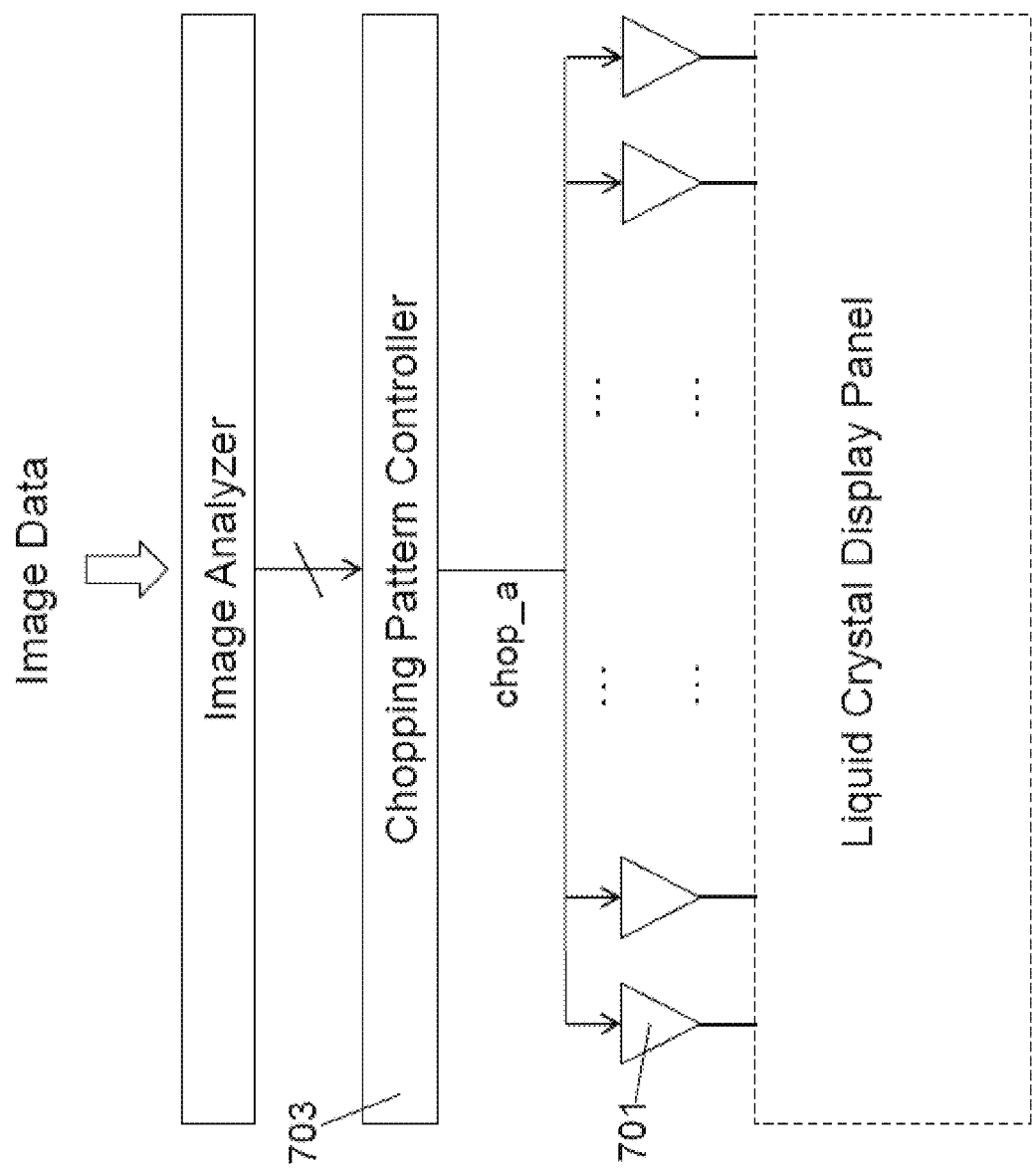
FIG. 7 is a schematic diagram of a system for offset cancellation for driving a display panel in accordance with yet another embodiment of the present patent application.

Referring to FIG. 7, all source amplifiers 701 are controlled by one signal, chop_a.

2-group aa . . . aabb . . . bb

The source amplifiers are divided into 2 groups of source amplifiers in sequence without overlaps.

2-group abababab . . . abababab

The source amplifiers are divided into 2 groups of source amplifiers. Control signals sequence is alternating chop_a, and chop_b. In this embodiment, source amplifiers of different groups are mixed in an alternating fashion.

Figure 9:
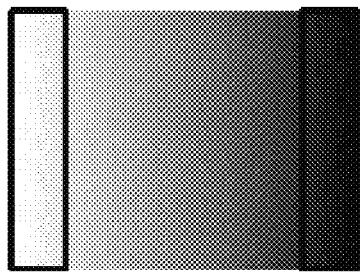
FIG. 9 shows four examples of how the image analyzer operates.
Figure 9:
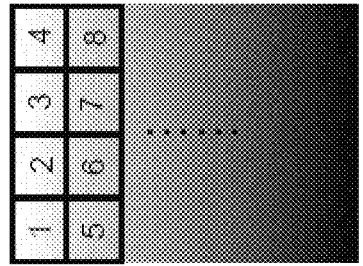
Figure 9:
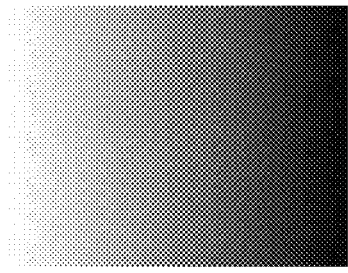
Figure 9:
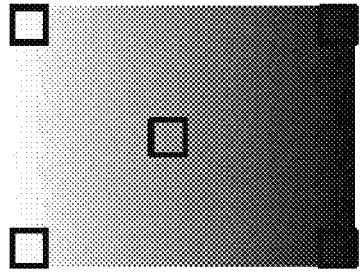

In the embodiments of FIG. 6 and FIG. 7, the image analyzer is configured to process the image data in a frame to determine which one of the possible chopping patterns best fits the image. To reduce its cost, power and size, the image analyzer may be configured to process the image data corresponding to representative regions of the image frame instead of all display data of the whole image (as shown in FIG. 9). Polarity pattern (inversion scheme) also has to be considered to choose the optimal chopping pattern.

Based on the analysis results of the image analyzer, the chopping pattern controller is configured to determine the optimal chopping control signals (chop_*) of the whole image.

A working example of the chopping pattern controller 703 (for the 1 group chopping signal case illustrated in FIG. 7) is shown below:
IF input (the image analyzer output)="indicator of general images", THEN output="chop_a alternates per line";
IF input (the image analyzer output)="indicator of 1 gray row, 1 black row", THEN output="chop_a alternates per two rows";
IF input (the image analyzer output)="indicator of 2 gray row, 2 black row", THEN output="chop_a alternates per four rows.

Figure 8:
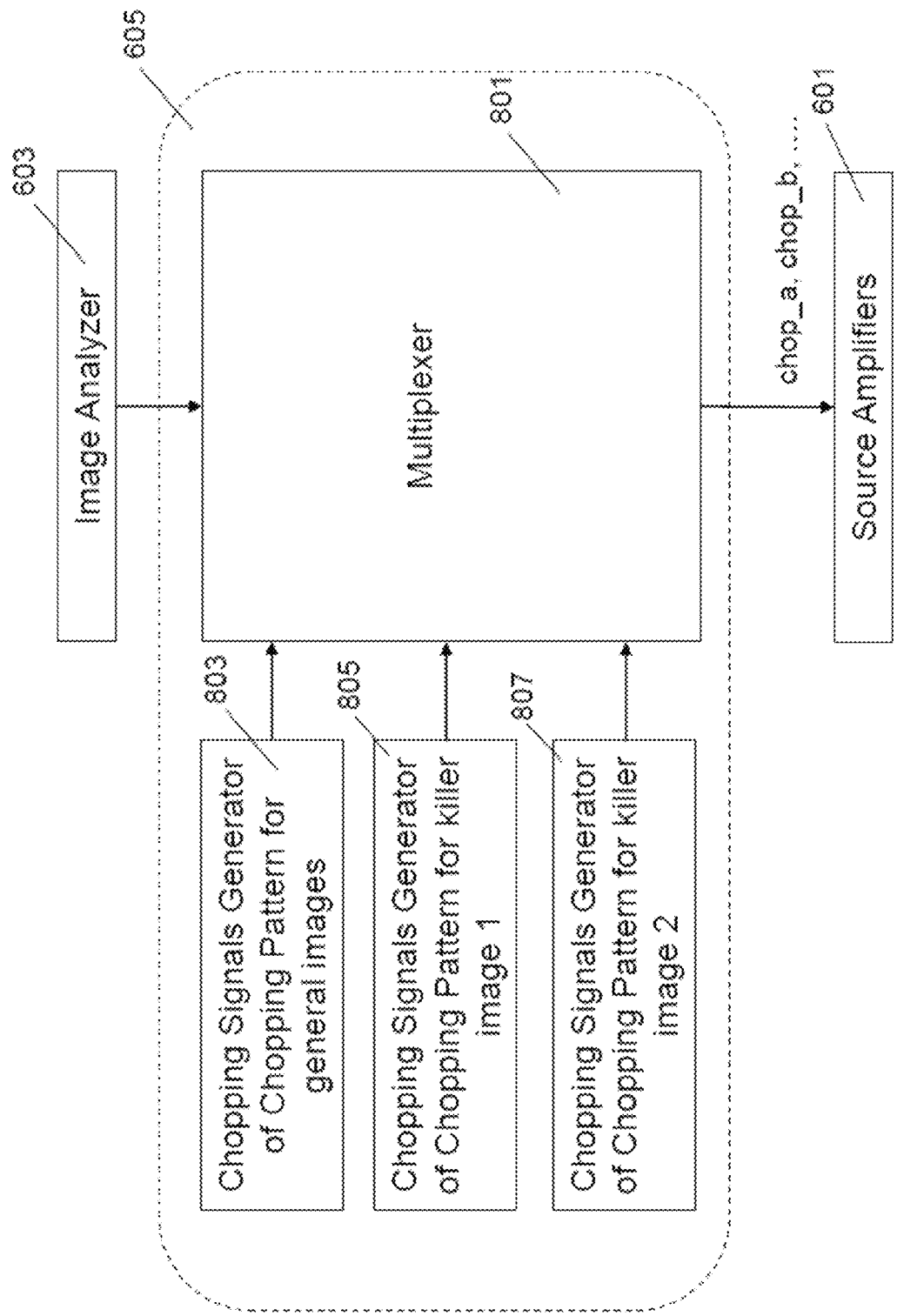
FIG. 8 is a schematic diagram illustrating the chopping pattern controller in the system depicted in FIG. 6.

FIG. 8 is a schematic diagram illustrating the chopping pattern controller in the system depicted in FIG. 6. Referring to FIG. 8, in this embodiment, the chopping pattern controller includes a multiplexor 801, a first chopping signals generator 803 connected with the multiplexor 801 and configured for generating chopping pattern signals for general images; a second chopping signals generator 805 connected with the multiplexor 801 and configured for generating chopping pattern signals for a first killer pattern image; and a third chopping signals generator 807 connected with the multiplexor 801 and configured for generating chopping pattern signals for a second killer pattern image.

FIG. 9 shows four examples of how the image analyzer operates. In the first example, the image analyzer is configured to analyze the whole image. In the second example, the image analyzer is configured to analyze representative regions at top few rows and bottom few rows. In the third example, the image analyzer is configured to analyze representative regions at four corners and the center. In the fourth example, the image analyzer is configured to analyze small regions of the image separately. In the fourth example, there are four groups of chopping control signals.

FIG. 10 illustrates two examples of possible chopping pattern options for a 1-Group order of chopping control signals. The choice is determined by image analysis result. Referring to FIG. 10, in part A, the chopping pattern is alternating chopping configuration every row (X,Y, X,Y, . . . ). In part B, the chopping pattern is alternating chopping configuration every 2 rows (X,X,Y,Y, . . . ).

For column inversion, referring to FIG. 11, chopping pattern (A) is good for most images, the chopping pattern (A) has flickering problem with killer pattern images (alternate single pixel line of two different greyscale levels). In this embodiment, the image analyzer is configured to estimate whether there is a high chance if the image has large areas of this killer pattern image characteristic, and if yes, choose chopping pattern (B) to accommodate the killer pattern images. Chopping pattern (A) may be chosen for other images. It is noted that the killer pattern image characteristics are pre-registered to the system.

In cascade applications, similar to source amplifiers chopping, the chopping pattern of the gamma amplifiers is configured to be adaptive to the display image according to another embodiment of the present patent application. Therefore the chopping technique is applied to these amplifiers so that the average output voltages of the gamma amplifiers in these display drivers are much close. Thus, the chopping pattern covers both gamma amplifiers and source amplifiers.

Figure 12:
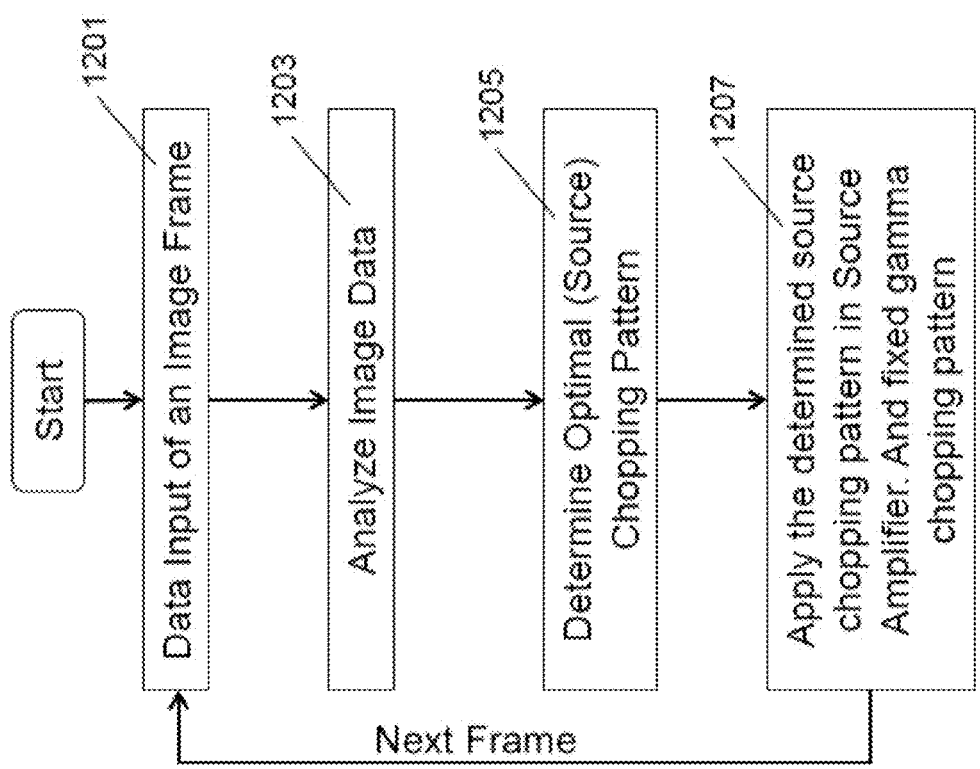
FIG. 12 is a flow chart illustrating a method for offset cancellation for driving a display panel in accordance with still another embodiment of the present patent application.

FIG. 12 is a flow chart illustrating a method for offset cancellation for driving a display panel in accordance with still another embodiment of the present patent application. Referring to FIG. 12, the method for offset cancellation for driving a display panel includes receiving a data input of an image frame (step 1201); analyzing the data input (i.e. image data) (step 1203); determining an optimal chopping pattern (step 1205); and applying the determined chopping pattern to a plurality of source amplifiers and applying a fixed gamma chopping pattern to a plurality of gamma amplifiers (step 1207).

FIG. 13 illustrates a working example of the method depicted in FIG. 12. In this embodiment, referring to FIG. 13, the image is a single-tone (grey) image or checkerboard image, or one of the most general images. Column inversion is used. The gamma chopping pattern is: GX,GX, GY,GY, . . . in 8-frame cycles, where GX and GY denote the two chopping directions of the gamma amplifiers. It is noted that the GX,GY,GX,GY, . . . chopping pattern cannot be used. It coincidently matches column inversion pattern (X,Y,X,Y), which leads to low spatial frequency domain components, and thus flickering.

Figure 14:
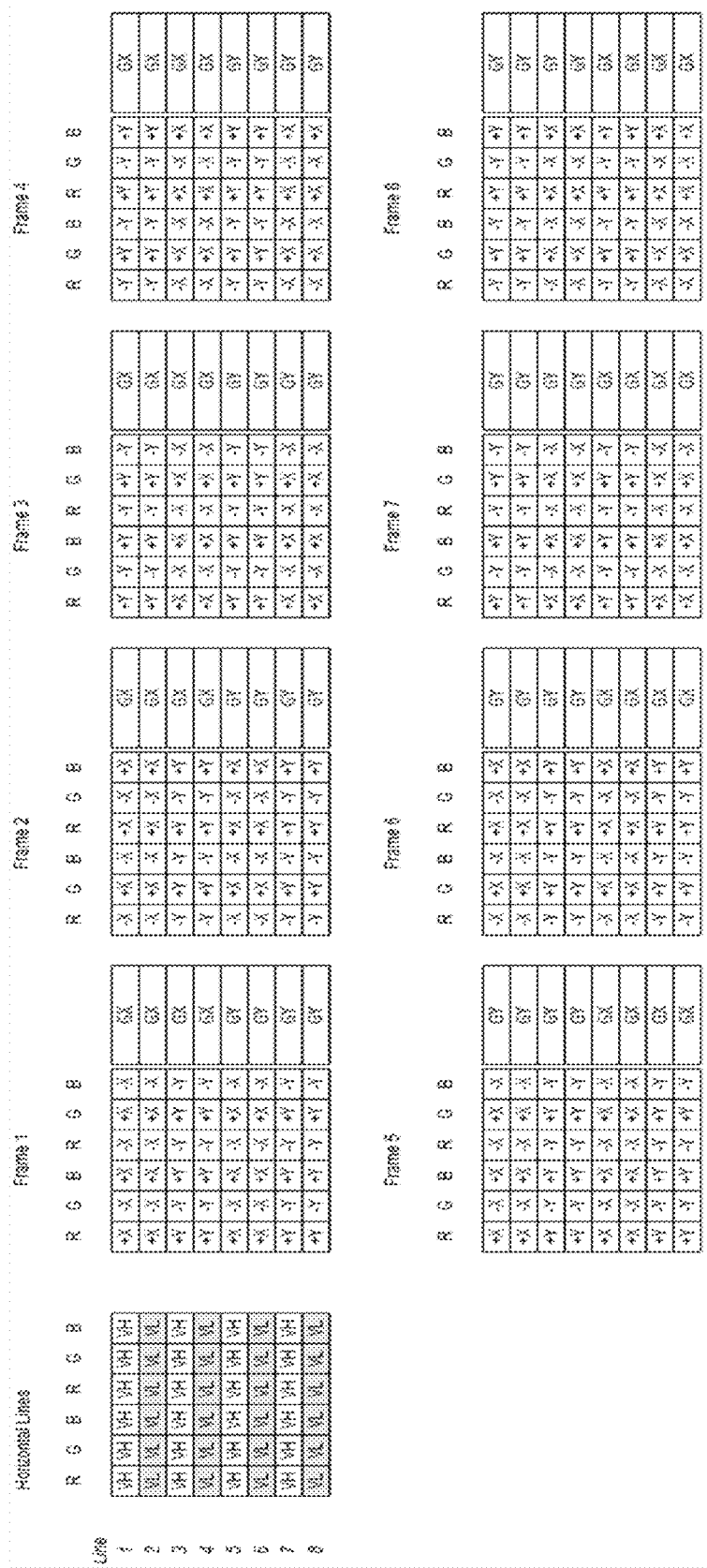
FIG. 14 illustrates another working example of the method depicted in FIG. 12.

FIG. 14 illustrates another working example of the method depicted in FIG. 12. As shown in FIG. 14, in this embodiment, the image is a Horizontal Lines (alternate single pixel line of two different greyscale levels) killer pattern image. Column inversion is used. A gamma chopping pattern of GX,GX,GX,GX,GY,GY,GY,GY, . . . in 8-frame cycles is used to avoid flickering. It is noted that the GX,GX,GY,GY, . . . chopping pattern cannot be used. It coincidently matches the image pixel grey levels VH, VL pattern, which leads to low spatial frequency domain components, and thus flickering.

The above mentioned static gamma amplifier chopping, which is not adaptive to image data, is subject to flickering problems with killer pattern images, the same as static source amplifier only chopping. According to another embodiment of the present patent application, the image analyzer is configured to estimate whether there is a high chance that the image has large areas of a killer pattern image characteristic and then determine a chopping pattern for the gamma amplifiers and source amplifiers accordingly.

Figure 15:
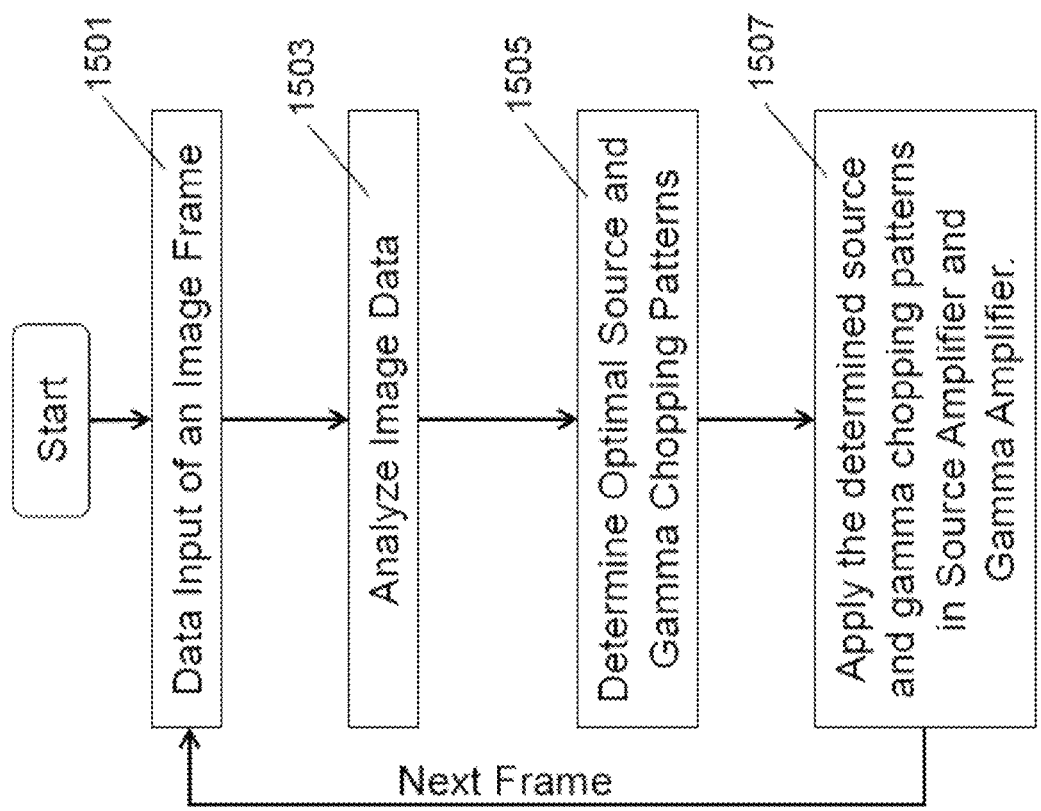
FIG. 15 is a flow chart illustrating a method for offset cancellation for driving a display panel in accordance with still another embodiment of the present patent application.

FIG. 15 is a flow chart illustrating a method for offset cancellation for driving a display panel in accordance with still another embodiment of the present patent application. Referring to FIG. 15, the method for offset cancellation for driving a display panel includes receiving a data input of an image frame (step 1501); analyzing the data input (i.e. image data) (step 1503); determining optimal chopping patterns for source amplifiers and gamma amplifiers respectively (step 1505); and applying the determined chopping patterns to a plurality of source amplifiers and a plurality of gamma amplifiers respectively (step 1507).

FIG. 16 shows a table illustrating comparison between cascade effects under different source chopping and gamma chopping. Referring to FIG. 16, when either the source chopping or the gamma chopping is static (row 2 and row 4), there is flickering on killer pattern images. When both the source chopping and the gamma chopping are adaptive (row 5), there is the least flickering (no flickering on detectable killer pattern images).

In the system and method for offset cancellation for driving a display panel provided by the above embodiments, the chopping pattern is not predetermined but adaptive for image data. The display quality for general images and killer pattern images is improved. The chopping pattern (offset cancellation) for general images uses the densest chopping pattern. Offset cancellation for killer pattern images (e.g., 1×1 checkers, black-gray horizontal lines) uses image-dependent chopping pattern to avoid side effects like flickering and vertical waves. Larger tolerance of amplifier offset and hence less static current of the source amp are achieved. In one application, source amplifier static current is reduced by 30%.

While the present patent application has been shown and described with particular references to a number of embodiments thereof, it should be noted that various other changes or modifications may be made without departing from the scope of the present invention.

What is claimed is:

1. A method for offset cancellation for driving a display panel, the method comprising:
   receiving a data input of an image frame with an image analyzer;
   analyzing the data input with the image analyzer;
   determining a chopping pattern that fits the data input based on analysis results of the image analyzer, with a chopping pattern controller; and
   applying the determined chopping pattern to a plurality of source amplifiers with the chopping pattern controller, the source amplifiers driving the display panel; wherein:
   the source amplifiers are divided into N groups, source amplifiers in each group being driven by a single chopping control signal;
   image data corresponding to representative regions of the image frame is analyzed by the image analyzer;
   chopping control signals for different regions of the image frame are determined by the chopping pattern controller;
   an indicator that indicates whether the image data being analyzed corresponds to a general image or one of pre-registered killer pattern images is generated by the image analyzer; and
   based on the indicator, a corresponded chopping pattern is generated by a chopping signal generator in the chopping pattern controller and transmitted to the source amplifiers thereby.

2. The method of claim 1, wherein source amplifiers of one group are packed together and separated from those of other groups.

3. The method of claim 1, wherein source amplifiers of different groups are mixed and packed together.

4. The method of claim 3, wherein source amplifiers of different groups are mixed in an alternating fashion.

5. The method of claim 1, wherein the chopping pattern is alternating chopping configuration every a number of rows.

6. The method of claim 1, wherein chance that the image frame has areas of pre-registered killer pattern image characteristics is determined by the image analyzer, based on which a chopping pattern is chosen by the chopping pattern controller.

7. The method of claim 1 further comprising applying a fixed gamma chopping pattern to a plurality of gamma amplifiers with the chopping pattern controller.

8. The method of claim 1 further comprising determining a gamma chopping pattern that fits the data input based on analysis results of the image analyzer with the chopping pattern controller; and applying the determined gamma chopping pattern to a plurality of gamma amplifiers with the chopping pattern controller.

9. A system for offset cancellation for driving a display panel, the system comprising:
a plurality of source amplifiers driving the display panel;
an image analyzer configured to receive a data input of an image frame and analyze the data input; and
a chopping pattern controller connected with the image analyzer and configured to determine a chopping pattern that fits the data input based on analysis results of the image analyzer, and apply the determined chopping pattern to the source amplifiers; wherein:
the source amplifiers are divided into N groups while the chopping pattern controller is configured to drive source amplifiers in each group by a single chopping control signal;
the image analyzer is configured to analyze image data corresponding to the whole image frame or representative regions of the image frame;
the chopping pattern controller is configured to determine chopping control signals for the whole image;
the image analyzer is configured to generate an indicator that indicates whether the image data being analyzed corresponds to a general image or one of pre-registered killer pattern images;
the chopping pattern controller comprises a plurality of chopping signal generators and a multiplexor connected to the chopping signal generators; and
based on the indicator, one of the chopping signal generators is configured to generate a corresponded chopping pattern and the multiplexor is configured to multiplex the chopping pattern and transmit the chopping pattern to the source amplifiers.

10. The system of claim 9, wherein source amplifiers of different groups are mixed and packed together.

11. The system of claim 10, wherein source amplifiers of different groups are mixed in an alternating fashion.

12. The system of claim 9, wherein the chopping pattern is alternating chopping configuration every a predetermined number of rows.

13. The system of claim 9, wherein the image analyzer is configured to determine chance that the image frame has areas of a pre-registered killer pattern image characteristic, based on which the chopping pattern controller is configured to choose a chopping pattern.

14. The system of claim 9, wherein the chopping pattern controller is configured to apply a fixed chopping pattern to a plurality of gamma amplifiers.

15. The system of claim 9, wherein the chopping pattern controller is configured to determine a gamma chopping pattern that fits the data input based on analysis results of the image analyzer; and the chopping pattern controller is configured to apply the determined gamma chopping pattern to a plurality of gamma amplifiers.

16. A system for offset cancellation for driving a display panel, the system comprising:
a plurality of source amplifiers driving the display panel;
an image analyzer configured to receive a data input of an image frame and analyze the data input; and
a chopping pattern controller connected with the image analyzer and configured to determine a chopping pattern that fits the data input based on analysis results of the image analyzer, and apply the determined chopping pattern to the source amplifiers; wherein:
the source amplifiers are divided into N groups while the chopping pattern controller is configured to drive source amplifiers in each group by a single chopping control signal; and
the image analyzer is configured to generate an indicator that indicates whether image data being analyzed corresponds to a general image or one of pre-registered killer pattern images.

17. The system of claim 16, wherein the image analyzer is configured to analyze image data corresponding to representative regions of the image frame; while the chopping pattern controller is configured to determine chopping control signals for the whole image frame.

18. The system of claim 16, wherein the chopping pattern controller is configured to apply a fixed chopping pattern to a plurality of gamma amplifiers.

19. The system of claim 16, wherein the chopping pattern controller is configured to determine a gamma chopping pattern that fits the data input based on analysis results of the image analyzer; and the chopping pattern controller is configured to apply the determined gamma chopping pattern to a plurality of gamma amplifiers.

20. The system of claim 16, wherein the chopping pattern controller comprises a plurality of chopping signal generators and a multiplexor connected to the chopping signal generators; based on the indicator, one of the chopping signal generators is configured to generate a corresponded chopping pattern and the multiplexor is configured to multiplex the chopping pattern and transmit the chopping pattern to the source amplifiers.

* * * * *